United States Patent
Park et al.

(10) Patent No.: US 9,373,748 B2
(45) Date of Patent: Jun. 21, 2016

(54) NITRIDE SEMICONDUCTOR LIGHT EMITTING DEVICE

(71) Applicant: Intellectual Discovery Co., Ltd., Seoul (KR)

(72) Inventors: Seong-Ju Park, Gwangju (KR);
Sang-Jun Lee, Gwangju (KR);
Sang-Hyun Hong, Gwangju (KR);
Sang-Jo Kim, Gwangju (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 0 days.

(21) Appl. No.: 14/226,577

(22) Filed: Mar. 26, 2014

(65) Prior Publication Data

US 2014/0319454 A1    Oct. 30, 2014

(30) Foreign Application Priority Data

Mar. 26, 2013    (KR) .......................... 10-2013-0032105

(51) Int. Cl.
*H01L 33/06* (2010.01)
*H01L 33/32* (2010.01)
*H01L 33/04* (2010.01)

(52) U.S. Cl.
CPC ................ *H01L 33/06* (2013.01); *H01L 33/32* (2013.01); *H01L 33/04* (2013.01)

(58) Field of Classification Search
CPC .......... H01L 33/06; H01L 33/32; H01L 33/04
USPC ......................................................... 257/13
See application file for complete search history.

(56) References Cited

U.S. PATENT DOCUMENTS

2008/0054247 A1*    3/2008    Eichler et al. ................... 257/13
2010/0133506 A1*    6/2010    Nakanishi et al. ............... 257/13

FOREIGN PATENT DOCUMENTS

JP    2002009400    *    1/2002

OTHER PUBLICATIONS

Park et al. ("Enhanced overall efficiency of GaInN-based light-emitting diodes with reduced efficiency droop by Al-composition-graded AlGaN/GaN Superlattice electron blocking layer," Applied Physics Letters 103, 061104.1-061104.4, 2013.*
Yu et al. ("Effects of InGaN layer thickness of AlGaN/InGaN superlattice electron blocking layer on the overall efficiency and efficiency droops of GaN-based light emitting diodes," Optics Express, vol. 22, No. S3, A663-A670, May 5, 2014).*
Translated abstract of Sumino, Masayoshi (JP 2002-009400).*

* cited by examiner

*Primary Examiner* — Yasser A Abdelaziez

(57) ABSTRACT

The present invention discloses a nitride semiconductor light emitting device with improved light efficiency. The nitride semiconductor light emitting device includes a n-type nitride layer and p-type nitride layer, an active layer disposed between the n-type and p-type nitride layers and with a multiple quantum well structure wherein a plurality of quantum well layers and a plurality of quantum barrier layers are stacked alternatively in the active layer, and a superlattice layer between the active layer and the p-type nitride layer with asymmetric structure. Herein, a thickness of a well layers gradually increases from the p-type nitride layer to the active layer and the height of the barrier layers gradually increases from the active layer to the p-type nitride layer and therefore, an injection efficiency of a hole supplied from p-type nitride layer to an active layer is increased.

2 Claims, 8 Drawing Sheets

LED A

LED A

NITRIDE SEMICONDUCTOR LIGHT EMITTING DEVICE

CROSS REFERENCE TO RELATED APPLICATION

This application claims priority from and the benefit of Korean Patent Application No. 10-2013-0032105 filed on Mar. 26, 2013, which is hereby incorporated by reference for all purposes as if fully set forth herein.

BACKGROUND OF THE INVENTION

1. Field of the Invention

The present invention relates to a nitride semiconductor light emitting device with improved light efficiency, more specifically to a nitride semiconductor light emitting device with improved light efficiency in which a hole injection efficiency from a p-type nitride layer to an active layer is improved through forming a superlattice layer with asymmetrical structure by changing a thickness of well layers or a height of barrier layers between an active layer and p-type nitride layer.

2. Discussion of the Background

In general, III elements such as Gallium Nitride (GaN), Aluminum Nitride (AlN), and Indium Gallium Nitride (InGaN) used for a nitride semiconductor emitting device are excellent in thermal stability and have an energy band structure with a direct band gap, and they recently came into the spotlight for blue and ultraviolet rays photoelectric element fields. Specially, a semiconductor with Gallium Nitride (GaN) receives attention through its narrowed energy band. A light emitting device using Gallium Nitride (GaN) based semiconductor is used in a flat panel display with large size and natural color, a traffic light, an internal lighting device, a light source with high density, an output system with high resolution, and an optical communication.

Thus, also an amount of driving current is varied since a nitride semiconductor light emitting device is used in various fields. In case of a mobile phone, it is operated in a low current such as 20 mA, but in case of backlight unit and lighting device with high output, it is operated in a current more than 100 mA or more than 350 mA.

In general, a carrier density of light emitting device increases as driving current increases, herein, an electron is not combined with a hole in a multi-quantum well and an electron overflow phenomenon to a p-type nitride layer is occurred.

In order to solve this problem, an electron blocking layer is formed between an active layer and a p-type nitride layer in a structure of light emitting device. An energy band of an electron blocking layer is large enough than a quantum well of an active layer, and overflow to p-type nitride layer without combination is prevented.

However, there is a problem that a hole injection efficiency is decreased since the electron blocking layer also affects a hole as an energy barrier which is provided from a p-type nitride layer to an active layer.

SUMMARY OF THE INVENTION

Therefore, the technical problem of the present invention is to provide a nitride semiconductor light emitting device with improved light efficiency in which a hole injection efficiency from p-type nitride layer to an active layer is improved through forming a superlattice layer with asymmetrical structure by changing a thickness of well layers or a height of barrier layers between an active layer and p-type nitride layer.

In addition, another technical problem of the present invention is to improve an entire luminescence efficiency of light emitting device by increasing a hole density in an active layer and thereby improving a recombination rate (internal quantum efficiency) of a hole and an electron.

Also, an electron overflow from n-type nitride layer to p-type nitride layer is reduced by replacing an electron blocking layer with a superlattice layer between an active layer and a p-type nitride layer.

To solve these problems, a light emitting device according to an exemplary embodiment of the present invention includes a n-type and p-type nitride layers, an active layer formed between the n-type and p-type nitride layers and with multi-quantum well structure in which plurality of quantum layers and plurality of quantum barrier layer are stacked alternatively, and a superlattice layer with asymmetric structure formed between the active layer and p-typed nitride layer.

A light emitting device according to an exemplary embodiment of the present invention includes the superlattice layer is obtained by changing a width of well layers or a height of barrier layers between an active layer and p-type nitride layer.

In other words, a width of the well layers within the superlattice layer are gradually increased from the p-type nitride layer to the active layer, or a height of the barrier layers are gradually increased from the active layer to the p-type nitride layer.'

Herein, the superlattice layer comprises a plurality of AlGaN/GaN.

According to a light emitting device of an exemplary embodiment of the present invention, there is an effect to increase a hole density supplied from a p-type nitride layer to an active layer improved through forming superlattice layer with asymmetrical structure by changing a width of well layers or a height of barrier layers between an active layer and p-type nitride layer.

Also, there is another effect to improve an entire luminescence efficiency of a light emitting device through improving a recombination rate (internal quantum efficiency) of a hole and an electron.

Also, an electron overflow from n-type nitride layer to p-type nitride layer is reduced by replacing an electron blocking layer with a superlattice layer between an active layer and a p-type nitride layer.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
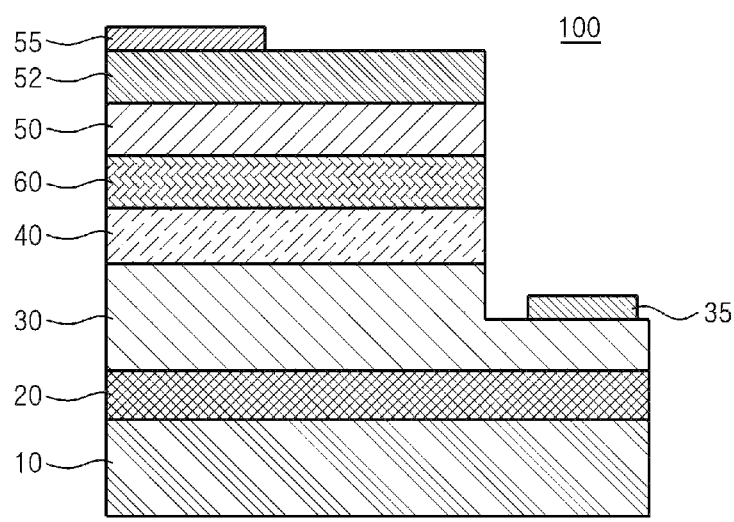
FIG. 1 is a cross sectional view of a light emitting device.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

Hereinafter, exemplary embodiments of the present invention will be described in detail with reference to the accompanying drawings.

FIG. 1 is a cross sectional view of a light emitting device.

As shown in FIG. 1, a nitride semiconductor light emitting device 100 comprises a substrate 10, a buffer layer 20, a n-type nitride layer 30, a n-type electrode 35, an active layer 40, a p-type nitride layer 50, a transparent electrode 52, a p-type electrode, and a superlattice layer 60.

The substrate 10 may be consisted of a material suitable for growing a single crystal nitride semiconductor. For example, the substrate 10 may be formed using material such as sapphire, also may be formed using zinc oxide (ZnO), Gallium Nitride (GaN), Silicon Carbide (SiC), Aluminum Nitride (AlN).

The n-type nitride layer 30 is formed above of the buffer layer 20. The n-type nitride layer 30 is formed based on Gallium Nitride (GaN), and may be doped with silicon (Si) to lower an operating voltage. The active layer 40 with multi quantum well MQW structure in which a quantum well layers and a quantum barrier layers are stacked alternatively is formed above of the n-type nitride layer 30. Herein, the quantum well layers is formed with InGaN, and the quantum barrier layer may be formed with GaN or AlGaN, however, it is not limited to the above materials, and various materials are used to form a layer.

The p-type nitride layer 50 is formed above of the active layer 40, and the superlattice layer SL 60 is disposed between the p-type nitride layer 50 and the active layer 40 to reduce an electron overflow phenomenon to the p-type nitride layer 50 and to provide a high hole density in the active layer 40.

Figure 2:
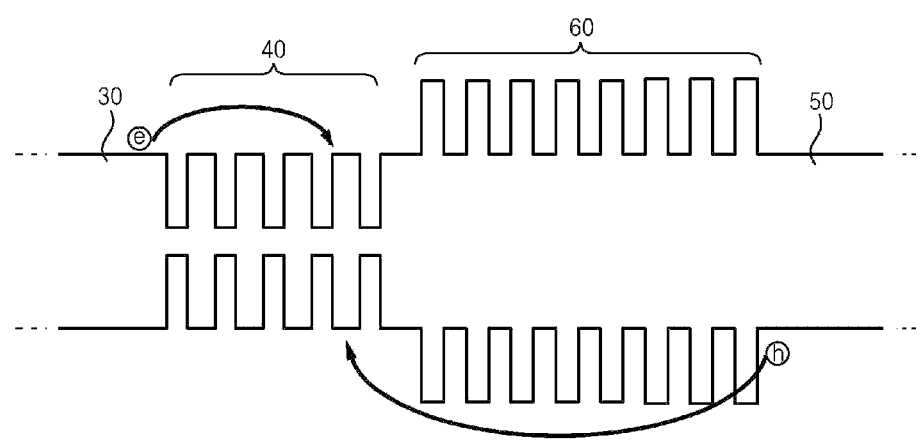
FIG. 2 is a figure showing an energy band diagram of a light emitting device according to a comparative example (LED A).
Figure 3A:
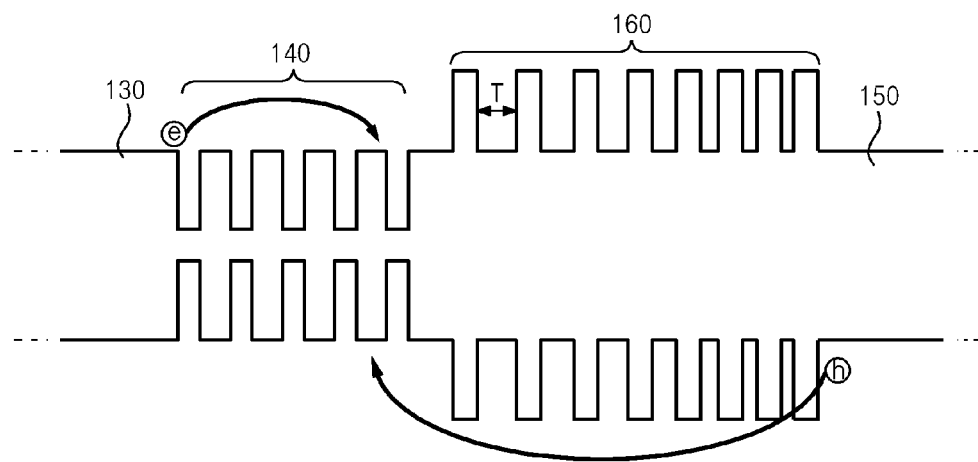
FIG. 3A and FIG. 3B are figures showing an energy band diagram according to exemplary embodiments of the present invention (LED B and LED C, respectively).
Figure 3B:
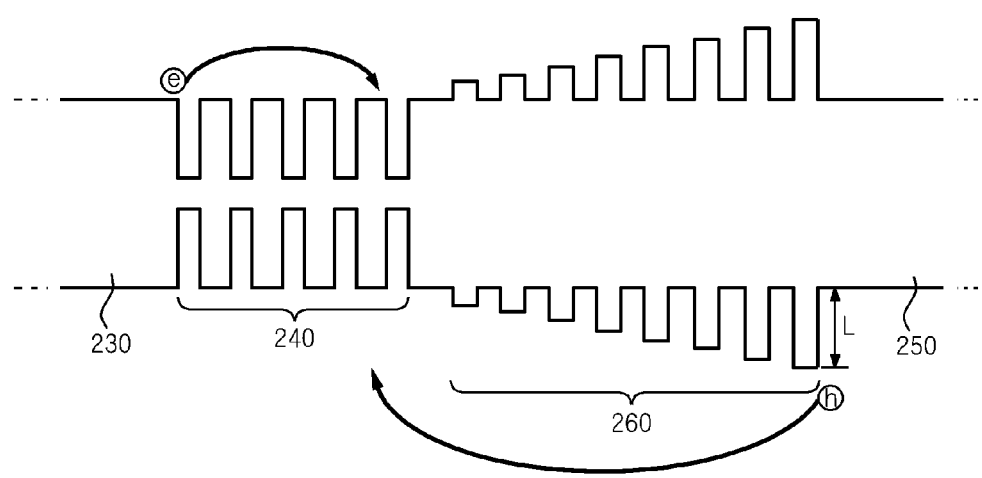

FIG. 2 is a figure showing an energy band diagram of a light emitting device according to a comparative example (LED A), and FIG. 3A and FIG. 3B are figures showing an energy band diagram according to exemplary embodiments of the present invention (LED B and LED C, respectively).

As shown in FIG. 2, an energy band of a superlattice layer 60 according to a comparative example is larger than energy bands of the n-type and p-type nitride layers 30 and 50 in order to reduce an electron e overflow phenomenon to p-type nitride layer 50 in an active layer 50.

However, in such a structure, it also affects a hole be supplied from a p-type nitride layer 50 to an active layer 40 as an energy barrier, and therefore a hole injection efficiency is significantly reduced.

Referring to FIG. 3A and FIG. 3B, in order to solve this problem, a nitride semiconductor light emitting device according to exemplary embodiments of the present invention (LED B and LED C, respectively) includes a n-type and p-type nitride layers 130 230, 150 and 250; an active layer 140 and 240 disposed between the n-type and p-type nitride layers 130 230 150 and 250 and with multi quantum well structure in which a plurality of quantum well layers and a plurality of quantum barrier layers are stacked alternatively; and a superlattice layer 160 and 260 between the active layer 140 and 240 and the p-type nitride layer 150 and 250.

As shown in FIG. 3A, according to an exemplary embodiment (LED B), a thickness T of the well layers within the superlattice layer 160 are gradually increased from the p-type nitride layer 150 to the active layer 140. In other words, since the thickness T of the well layers is thinner, an activation energy of an electron e becomes higher, and thereby, an electron overflow phenomenon is prevented in which an electron e is not recombined with a hole within multiple quantum well and is overflowed to p-type nitride layer 150.

In addition, since the thickness T of the well layers is thinner, a hole density supplied from p-type nitride layer 150 to the active layer 140 becomes high.

As shown in FIG. 3B, according to an exemplary embodiment (LED C), a thickness T of the well layers within the superlattice layer 160 are gradually increased from the active layer 140 to the p-type nitride layer 150. That is to say, an energy barrier layers of an activation energy of an electron moving from the active layer 240 to the p-type nitride layer 260 becomes high, and an energy barrier layer of an activation energy of a hole moving from p-type nitride layer 250 to the active layer 240 becomes low.

A thickness T and a height H of the well layers is gradually changed according to exemplary embodiments of the present invention (LED B and LED C, respectively), however, it is not limited to the above explanation, and various forms of structures may be applied.

FIGS. 4A to 6C are graphs showing a simulation result corresponding to an electrical property, an energy band, and a carrier density according to exemplary embodiments of the present invention and comparative example.

Figure 4A:
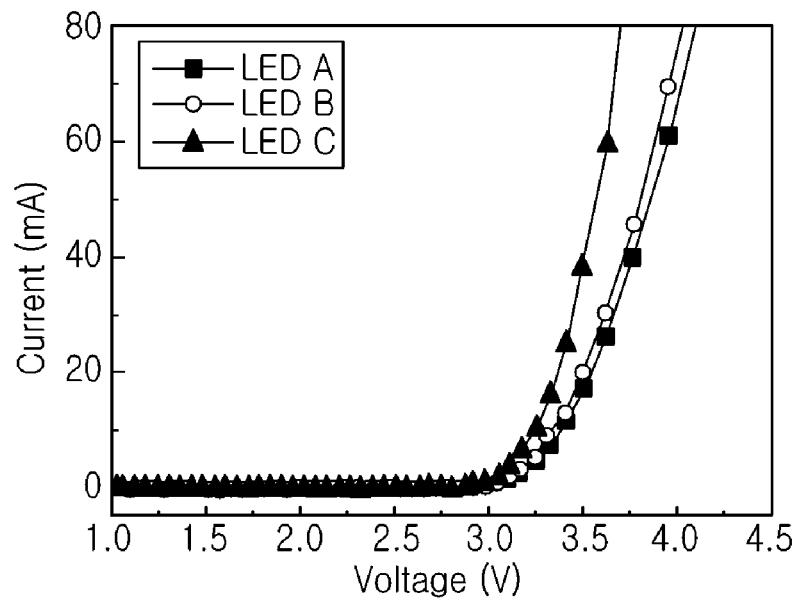
FIG. 4A and FIG. 4B are graphs showing a simulation result corresponding to an electrical property according to exemplary embodiments of the present invention and comparative example.
Figure 4B:
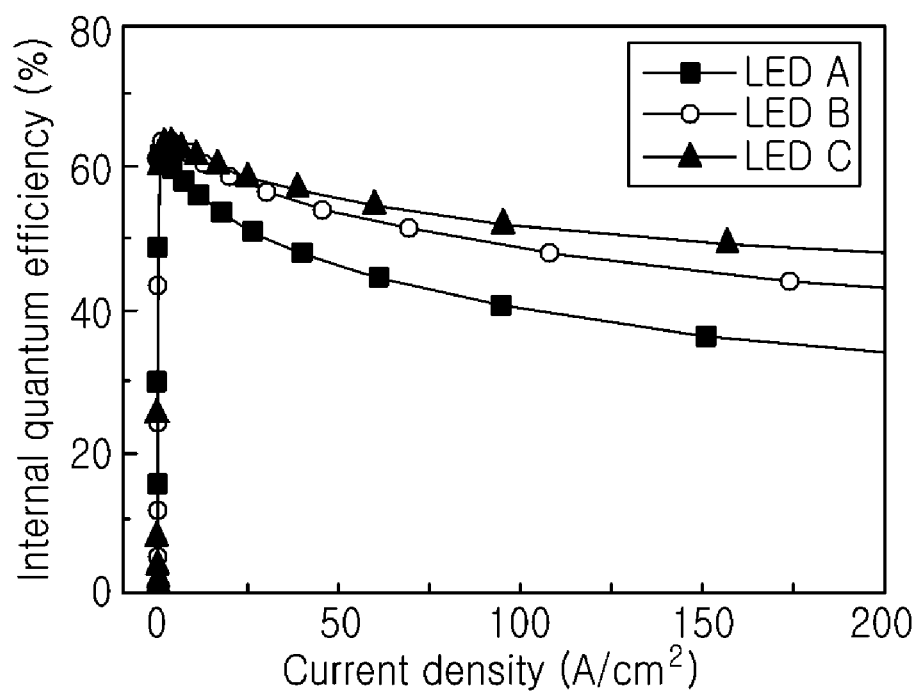

First referring to FIGS. 4A and 4B, it may be confirmed that an electrical property is improved that that of a comparative example (LED A) which includes an electron blocking layer, and it is achieved by applying a superlattice layer with asymmetric structure according to exemplary embodiments of the present invention.

In other words, an operating voltage of light emitting device according to embodiments of the present invention (LED B and LED C, respectively) is lower than that of light emitting device according a comparative example (LED A), and it is confirmed that a droop property of internal quantum efficiency IQE in high current density is maintained gradually constant, therefore, there is high probability of applying to backlight and lighting device with high output.

Figure 5A:
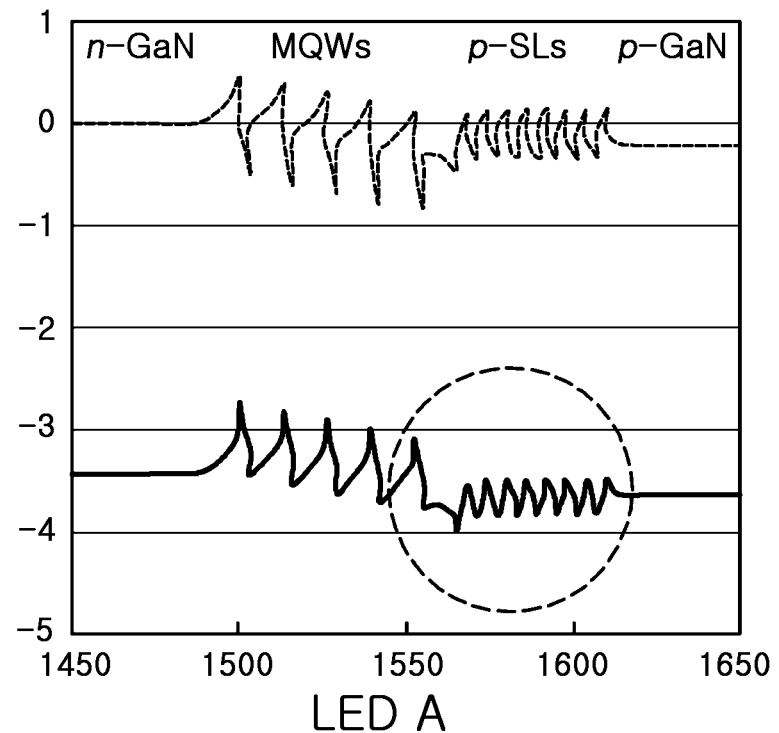
FIG. 5A through FIG. 5F are graphs showing a simulation result corresponding to an energy band according to exemplary embodiments of the present invention and comparative example.
Figure 5B:
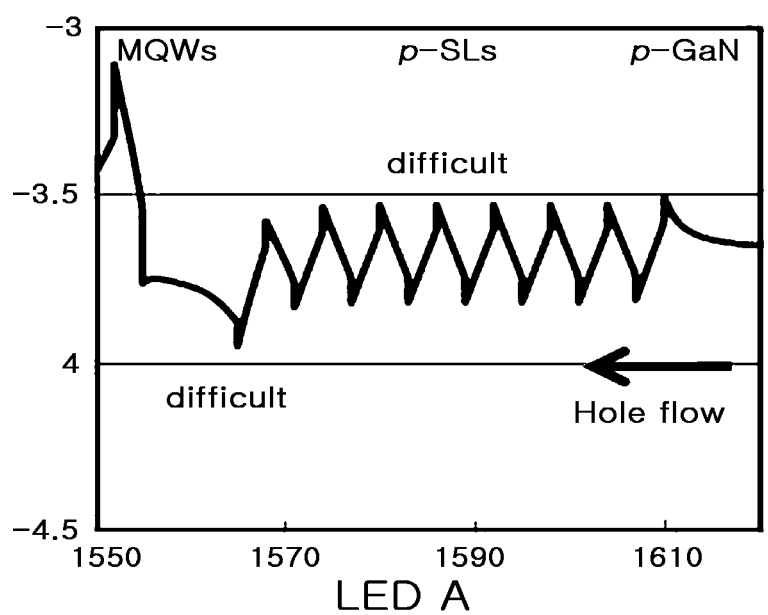
Figure 5C:
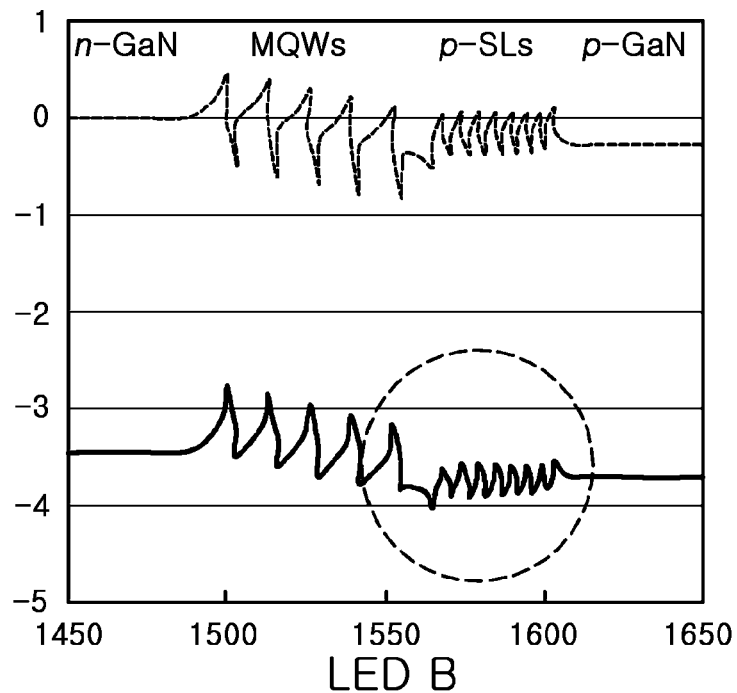
Figure 5D:
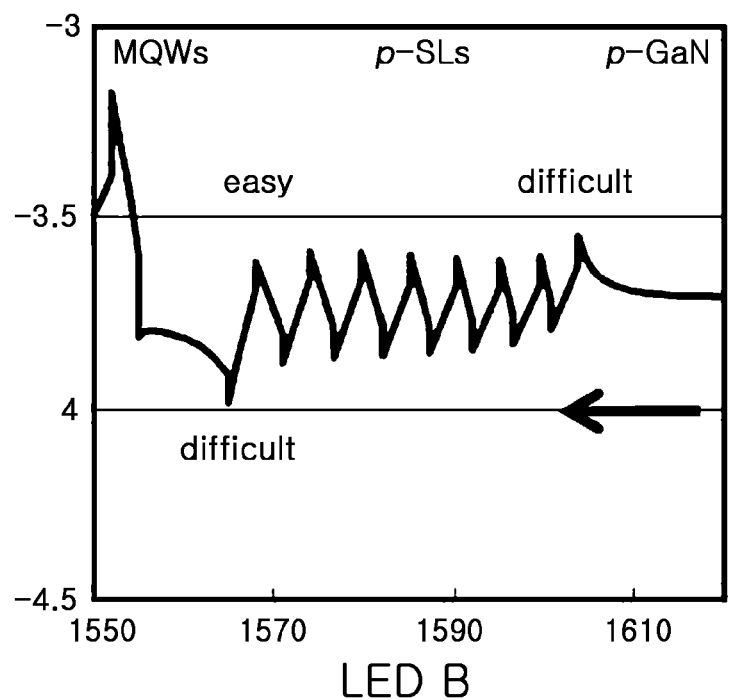
Figure 5E:
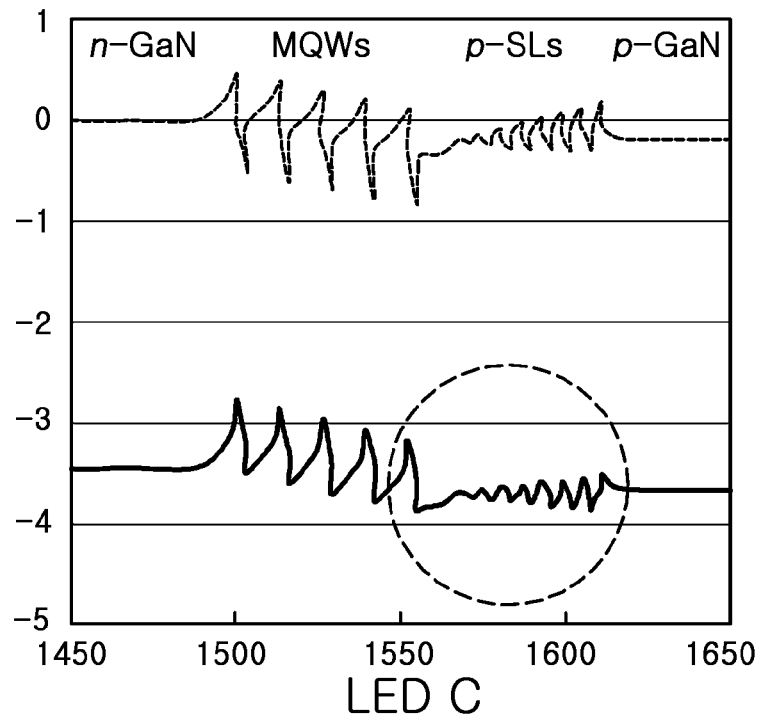
Figure 5F:
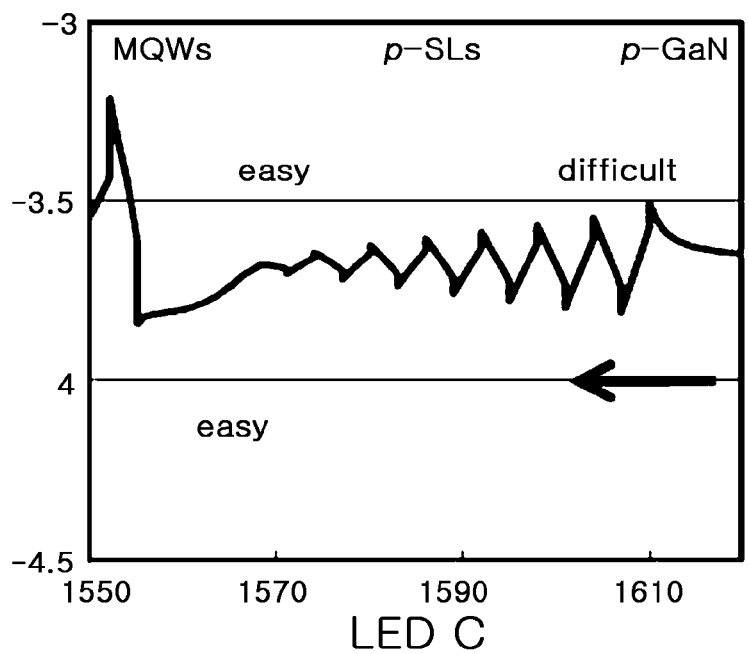

As shown in FIG. 5A through 5F, it is shown that an energy band barrier of superlattice layer according to embodiments of the present invention (LED B and LED C, respectively) is mitigated than that of superlattice layer according a comparative example (LED A). FIG. 5B is an enlarged view of circle of FIG. 5A, FIG. 5D is an enlarged view of circle of FIG. 5C, and FIG. 5F is an enlarged view of circle of FIG. 5E.

In other words, it means that an energy barrier of a hole according to the superlattice layer 160 and 260 becomes lower, and an injection efficiency of a hole from the p-type nitride layer 150 and 250 to the active layer 140 and 240 is increased.

Figure 6A:
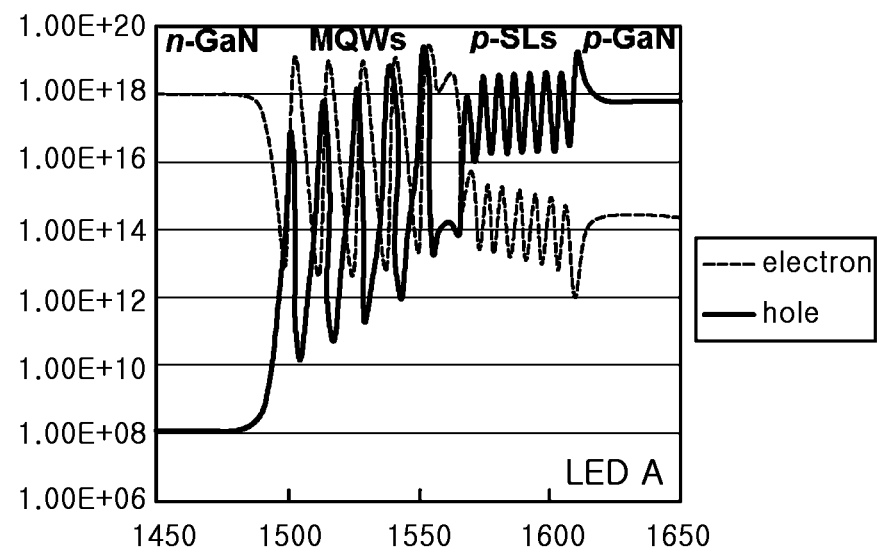
FIG. 6A through FIG. 6C are graphs showing a simulation result corresponding to a carrier density according to exemplary embodiments of the present invention and comparative example.
Figure 6B:
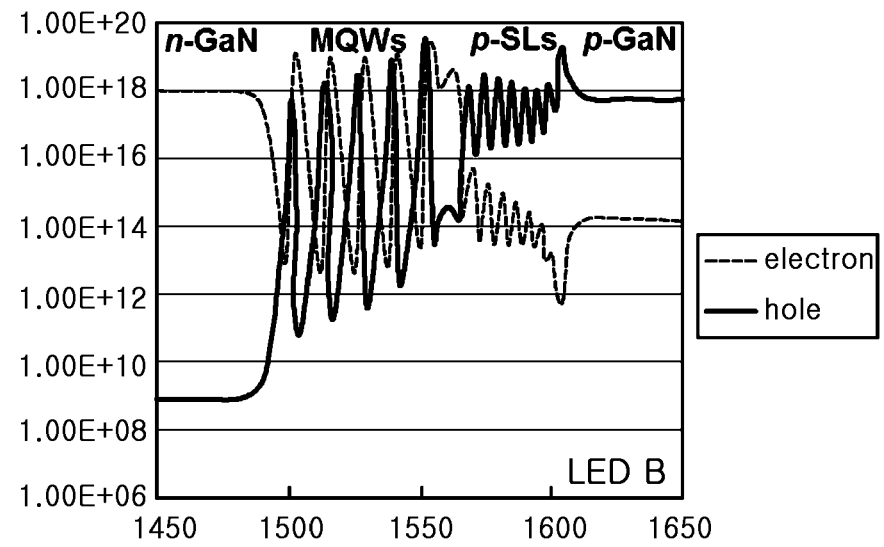
Figure 6C:
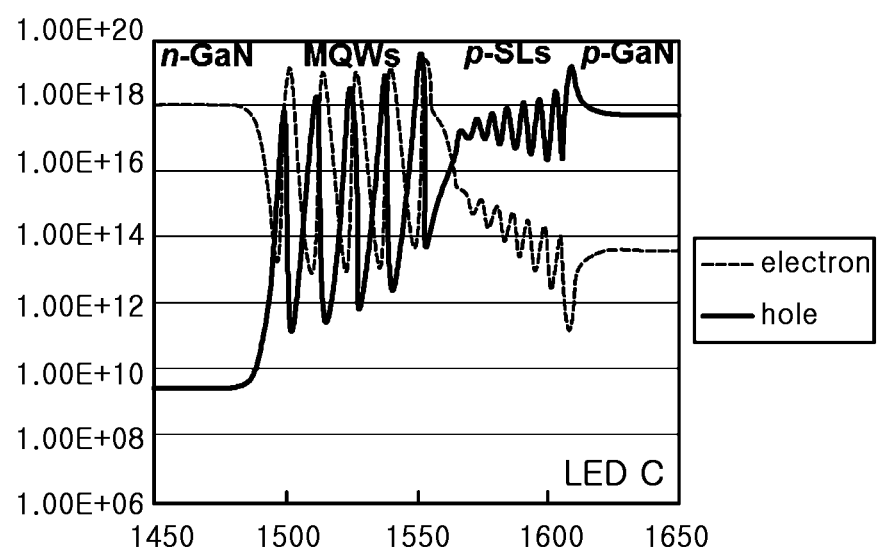

Referring to FIG. 6A through FIG. 6C, comparing a hole density between a comparative example (LED A) and embodiments exemplary of the present invention (LED B and LED C, respectively), a comparative example (LED A) is $4.62*10^{18}$ (/cm$^3$), an embodiment exemplary of the present invention (LED B) is $7.60*10^{18}$ (/cm$^3$), and an embodiment exemplary of the present invention (LED C) is $1.03*10^{19}$ (/cm$^3$), and it is known that a hole density of light emitting device according to embodiments exemplary of the present invention in the active layer is higher and uniform within identical current density (60 A/cm$^2$).

Also, it shows that an electron overflow phenomenon in p-type nitride layer is effectively prevented since an electron density in p-type nitride layer according to embodiments exemplary of the present invention (LED B and LED C, respectively) in relatively lower than that of a comparative example (LED A). In addition, it also means that a recombination efficiency between an electron and a hole in an active layer is increased.

As above, a structure of superlattice applied to a horizontal-type semiconductor light emitting device is explained, but it is not limited to a horizontal-type it may be applied to a vertical-type semiconductor light emitting device.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A nitride semiconductor light emitting device comprising:
    a n-type nitride layer and a p-type nitride layer;
    an active layer disposed between the n-type and the p-type nitride layer and with a multiple quantum well structure wherein a plurality of quantum well layers and a plurality of quantum barrier layer are stacked alternatively in the active layer; and
    an electron blocking layer formed by a superlattice layer between the active layer and the p-type nitride layer with asymmetric structure with respect to a center thereof, wherein the superlattice layer includes well layers and barrier layers alternately stacked with each other and the thickness of the well layers within the superlattice layer are gradually increased along a direction from the p-type nitride layer to the active layer.

2. The nitride semiconductor light emitting device of claim 1, wherein the superlattice layer comprises a plurality of AlGaN/GaN.

* * * * *